United States Patent
Peterson et al.

(10) Patent No.: US 12,238,896 B2
(45) Date of Patent: Feb. 25, 2025

(54) VAPOR-AIR TRANSITION DETECTION FOR TWO-PHASE LIQUID IMMERSION COOLING

(71) Applicant: Microsoft Technology Licensing, LLC, Redmond, WA (US)

(72) Inventors: Eric Clarence Peterson, Woodinville, WA (US); Christian L. Belady, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 165 days.

(21) Appl. No.: 17/844,633

(22) Filed: Jun. 20, 2022

(65) Prior Publication Data

US 2023/0413485 A1 Dec. 21, 2023

(51) Int. Cl.
*H05K 7/20* (2006.01)

(52) U.S. Cl.
CPC ......... *H05K 7/20381* (2013.01); *H05K 7/203* (2013.01); *H05K 7/20318* (2013.01); *H05K 7/20336* (2013.01)

(58) Field of Classification Search
CPC .. H05K 7/20; H05K 7/20218; H05K 7/20236; H05K 7/20272; H05K 7/20282; H05K 7/203; H05K 7/20318; H05K 7/20327; H05K 7/20336; H05K 7/20381; H05K 7/20781; H05K 7/2079; H05K 7/20809; H05K 7/20818; H05K 7/20827;
(Continued)

(56) References Cited

U.S. PATENT DOCUMENTS

| 4,375,157 A | * | 3/1983 | Boesen | H05K 7/20336 62/51.1 |
| 5,099,908 A | * | 3/1992 | Taraci | G01R 31/2891 374/57 |
| 10,765,033 B1 | * | 9/2020 | Keehn | H05K 7/203 |

(Continued)

FOREIGN PATENT DOCUMENTS

| CN | 201532076 U | * | 7/2010 |
| CN | 104634144 A | | 5/2015 |

(Continued)

OTHER PUBLICATIONS

CN-201532076-U English Translation (Year: 2010).*
(Continued)

*Primary Examiner* — Amir A Jalali
(74) *Attorney, Agent, or Firm* — Mark K. Young; Mark Young PC

(57) ABSTRACT

The disclosed technology is generally directed to vapor-air transition detection for two-phase liquid immersion cooling. In one example of the technology, a first device is cooled via two-phase liquid immersion cooling, such that the first device is submerged in a dielectric liquid in a system, and such that a boiling temperature of the dielectric liquid is a temperature that is suitable for keeping the first device cool. A portion of a first strip that is disposed in the system above the dielectric liquid is cooled. The first strip is composed of a thermo-conductive material. While the portion of the first strip is being cooled, via the first strip, a location of a vapor-air boundary in the system is determined based on a detected temperature along a length of the first strip.

20 Claims, 6 Drawing Sheets

(58) Field of Classification Search
CPC ...... G06F 1/20; G06F 1/206; G06F 2200/201; F28D 1/0213
See application file for complete search history.

(56) References Cited

U.S. PATENT DOCUMENTS

| | | | |
|---|---|---|---|
| 2007/0240852 A1 | 10/2007 | Liu et al. | |
| 2015/0377949 A1* | 12/2015 | Ramirez | G01R 22/068 |
| | | | 324/105 |
| 2019/0357379 A1* | 11/2019 | Kolar | H05K 7/20827 |
| 2020/0323100 A1 | 10/2020 | Chiu et al. | |
| 2021/0120705 A1 | 4/2021 | Enright et al. | |
| 2022/0256744 A1* | 8/2022 | Le | H05K 7/20318 |
| 2022/0361378 A1* | 11/2022 | Alissa | H05K 7/203 |
| 2023/0067857 A1* | 3/2023 | Gao | H05K 7/20827 |
| 2023/0217630 A1* | 7/2023 | Gao | H05K 7/20818 |
| | | | 361/699 |
| 2023/0341910 A1* | 10/2023 | Ramakrishnan ... | H05K 7/20327 |
| 2024/0064936 A1* | 2/2024 | Liu | H05K 7/20381 |

FOREIGN PATENT DOCUMENTS

| | | |
|---|---|---|
| DE | 3214886 A1 | 10/1983 |
| JP | H03156292 A | 7/1991 |

OTHER PUBLICATIONS

"International Search Report and Written Opinion Issued in PCT Application No. PCT/US23/019721", Mailed Date: Jul. 28, 2023, 17 Pages.

Gunnerson, et al., "Visualizing the Thermal Performance of Heat Pipes with Thermochromic Liquid Crystals", In Proceedings of the 26th Intersociety Energy Conversion Engineering Conference, vol. 4, Jan. 1, 1991, 1 Page.

* cited by examiner

VAPOR-AIR TRANSITION DETECTION FOR TWO-PHASE LIQUID IMMERSION COOLING

BACKGROUND

Immersion cooling is a cooling practice by which, typically, heat-generating components are submerged in a thermally conductive but electrically insulating dielectric liquid or coolant. In two-phase liquid immersion cooling, typically, the liquid changes phase to a gas at a temperature appropriate for cooling the heat-generating components. Typically, this phase change, whether from a liquid to a gas or a gas to a liquid, is an isothermal reaction, meaning that as the material changes phases, the temperature of the material remains constant and will keep the surface temperature of the heat-generating components being cooled constant. Typically, at some point, a condenser of a two-phase liquid immersion cooling system will convert the gas back into a liquid, which will then be reused in the system to cool the heat-generating components.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Briefly stated, the disclosed technology is generally directed to vapor-air transition detection for two-phase liquid immersion cooling. In some examples, a first device is cooled via two-phase liquid immersion cooling, such that the first device is submerged in a dielectric liquid in a system, and such that a boiling temperature of the dielectric liquid is a temperature that is suitable for cooling the first device. In some examples, a portion of a first strip that is disposed in the system above the dielectric liquid is cooled. In some examples, the first strip is composed of a thermoconductive material. In some examples, while the portion of the first strip is being cooled, via the first strip, a location of a vapor-air boundary in the system is determined based on a detected temperature along a length of the first strip.

Other aspects of and applications for the disclosed technology will be appreciated upon reading and understanding the attached figures and description.

BRIEF DESCRIPTION OF THE DRAWINGS

Non-limiting and non-exhaustive examples of the present disclosure are described with reference to the following drawings. In the drawings, like reference numerals refer to like parts throughout the various figures unless otherwise specified. These drawings are not necessarily drawn to scale.

For a better understanding of the present disclosure, reference will be made to the following Detailed Description, which is to be read in association with the accompanying drawings, in which.

DETAILED DESCRIPTION

Figure 1:
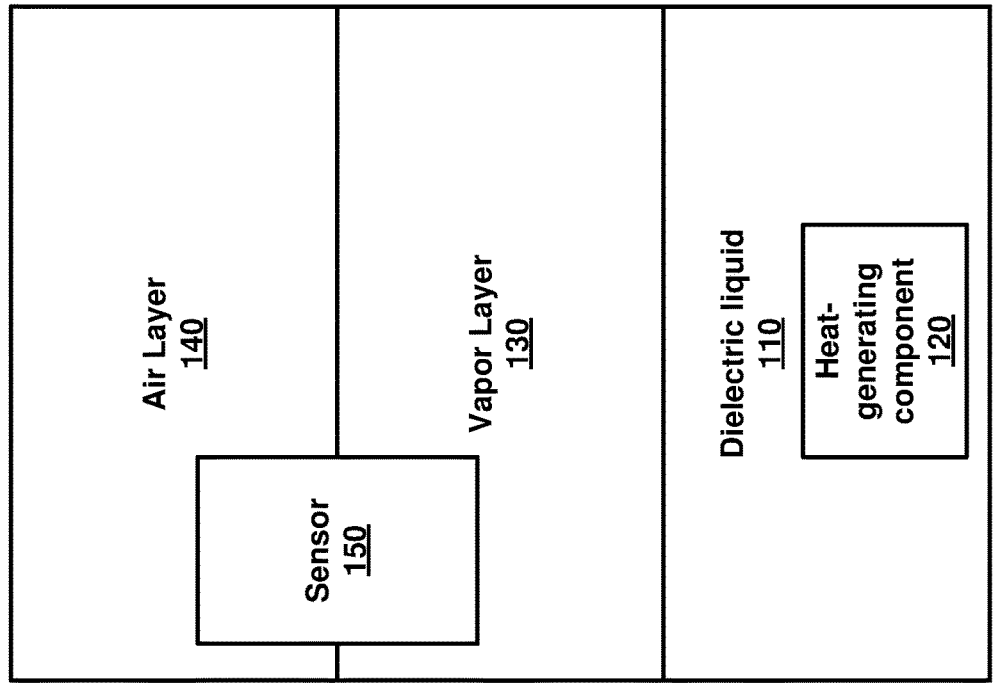
FIG. 1 is a functional block diagram illustrating an example of a liquid-cooled system.

The following description provides specific details for a thorough understanding of, and enabling description for, various examples of the technology. One skilled in the art will understand that the technology may be practiced without many of these details. In some instances, well-known structures and functions have not been shown or described in detail to avoid unnecessarily obscuring the description of examples of the technology. It is intended that the terminology used in this disclosure be interpreted in its broadest reasonable manner, even though it is being used in conjunction with a detailed description of certain examples of the technology. Although certain terms may be emphasized below, any terminology intended to be interpreted in any restricted manner will be overtly and specifically defined as such in this Detailed Description section. Throughout the specification and claims, the following terms take at least the meanings explicitly associated herein, unless the context dictates otherwise. The meanings identified below do not necessarily limit the terms, but merely provide illustrative examples for the terms. For example, each of the terms "based on" and "based upon" is not exclusive, and is equivalent to the term "based, at least in part, on," and includes the option of being based on additional factors, some of which may not be described herein. As another example, the term "via" is not exclusive, and is equivalent to the term "via, at least in part," and includes the option of being via additional factors, some of which may not be described herein. The meaning of "in" includes "in" and "on." The phrase "in one embodiment," or "in one example," as used herein does not necessarily refer to the same embodiment or example, although it may. Use of particular textual numeric designators does not imply the existence of lesser-valued numerical designators. For example, reciting "a widget selected from the group consisting of a third foo and a fourth bar" would not itself imply that there are at least three foo, nor that there are at least four bar, elements. References in the singular are made merely for clarity of reading and include plural references unless plural references are specifically excluded. The term "or" is an inclusive "or" operator unless specifically indicated otherwise. For example, the phrases "A or B" means "A, B, or A and B." As used herein, the terms "component" and "system" are intended to encompass hardware, software, or various combinations of hardware and software. Thus, for example, a system or component may be a process, a process executing on a computing device, the computing device, or a portion thereof.

Two-phase liquid immersion cooling may be used to cool heat-generating components, such as servers. The two-phase liquid immersion cooling may be performed, for example, using a tank in which one or more heat-generating components are immersed in a dielectric liquid. As a result of the liquid phase change, the tank may include a vapor layer (i.e., composed of two-phase vapor) above the two-phase dielectric liquid. The two-phase vapors may have a significantly greater density than air and therefore may tend to reside below air in the tank but above the dielectric liquid. The tank may include a condenser in the vapor area of the system that converts the two-phase vapor back into a liquid. Air that is present in the tank may help ensure that there is not so much vapor that there is risk of vapor overflowing and escaping. If vapor escapes, this may be undesirable because escaping vapor may waste vapor, causing increased expenses.

To ensure the efficient operations of the two-phase immersion cooling system, the vapor level in the tank should be neither too high nor too low. However, it may be difficult to determine whether the vapor level is too low or too high in a two-phase immersion cooling system. Typically, the vapor used in a two-phase immersion cooling system is colorless, and therefore the vapor level cannot be determined by mere visual inspection.

Problems or inefficient operation may occur if the vapor level in the tank is too high or too low. For example, if there is so much air in the system that the air is below the level of the condenser, this could interfere with the operation of the condenser by insulating the vapor from the condenser. Furthermore, if the system contains too much vapor, the vapor may overflow and escape which, as discussed above, may be undesirable. Various conditions may occur with the condenser that may prevent the condenser from properly condensing the vapors back into the dielectric liquid. For example, if the cooling system has insufficient cooling capacity, the tank may start to fill up with vapors and eventually overflow.

A two-phase liquid immersion system, in accordance with embodiments of the invention, includes a vapor-air transition sensor. The vapor-air transition sensor may be used to determine the location of the vapor-air boundary in the system, so that appropriate actions can be taken if the vapor level is either too low or too high. The location of the vapor-air boundary in the system may include, for example, the height of the vapor-air boundary from a given point in the system. In some examples, the vapor-air transition sensor is located in the tank above the dielectric liquid, in the expected area of the transition. The sensor may be used to detect the location of the transition. The vapor-air transition detection sensor may include a strip of thermo-conductive material. For instance, the vapor-air transition detection sensor may include a heat pipe in some examples. In some examples, the vapor-air transition detection sensor is placed above the dielectric liquid, in a position with the expected vapor-air transition zone near the middle of the vapor-air transition detection sensor. In some examples, the strip is long enough to at least cover the zone of interest in which the vapor-air boundary is expected to be, with additional length of at least about two inches if an external cooler is used to cool a portion of the strip, as discussed in greater detail below. For instance, in some examples, the strip is about 10 to 12 inches in length.

In some examples, a portion of the vapor-air transition detection sensor, such as the top end of the vapor-air transition detection sensor, is cooled, e.g., via contact with a cooling device, chilling device, heat sink, or the like. For instance, in some examples, the top end of the vapor-air detection sensor is cooled with a Peltier cooler. The "top end" of the vapor-air detection sensor refers to the end of the sensor that is farthest from the dielectric liquid. Due to the different properties of the vapor layer and the air layer, the cooling of the vapor-air transition detection sensor will have different effects on the regions of the vapor-air transition detection sensor in contact with the air layer than on the regions in contact with the vapor layer.

For example, the vapor-air transition detection sensor will have different temperatures along the length of the vapor-air transition detection sensor, with the region in contact with the air layer being generally cooler than the region in contact with the vapor layer. In some examples, a portion of the cooled heat pipe residing in the vapor layer will cause the surrounding vapor to condense, which holds the surface temperature of the vapor-air transition detection sensor near the boiling point of the dielectric liquid. In contrast, the air layer does not have a boiling point near that of the dielectric liquid, thus the region of the vapor-air transition detection sensor in contact with the air layer will have a greater temperature decrease from the applied cooling. In these examples, the surface of the vapor-air transition detection sensor will remain at a temperature below the boiling point of the dielectric liquid. In some examples, the point along the length of the vapor-air transition detection sensor where the surface temperature of the vapor-air transition detection sensor drops below the boiling point of the dielectric liquid corresponds to the transition layer between the air and the two-phase vapors.

In these examples, this cooling causes the point along the length of the vapor-air transition detection sensor where the surface temperature of the vapor-air transition detection sensor drops below the boiling point of the dielectric liquid to correspond to the transition layer between the air and the two-phase vapors. Accordingly, in these examples, cooling the portion of the vapor-air transition detection sensor enables the vapor-air transition sensor to be used to determine the location of the vapor-air transition.

In some examples, the vapor-air transition detection sensor is coated with a thermo-chromatic material such as a dye or paint that changes color at the temperature corresponding to the boiling point of the dielectric liquid. In this way, in these examples, the location of the vapor-air transition can be visually seen by observing the vapor-air transition detection sensor. In some examples, an array of temperature sensors is coupled to the vapor-air transition detector. For instance, in some examples, the array of temperature sensors is attached along the length of the vapor-air transition detection sensor. The temperature sensors may be thermo-couples, thermal sensing diodes, or other suitable sensors for measuring temperature. In these examples, the location of the vapor-air transition is then known to be between the two adjacent temperature sensors of the array at which one of the adjacent sensors detects that the surface temperature of the vapor-air transition detection sensor is at the boiling point of the dielectric liquid and the other adjacent sensor detects that the surface temperature of the vapor-air transition detection sensor is below the boiling point of the dielectric liquid. Accordingly, in these examples, the output of the temperature sensors of the array indicates the location of the vapor-air transition.

Illustrative Device

FIG. 1 is a functional block diagram illustrating an example of system 100. System 100 may include dielectric liquid 110, heat-generating component 120, vapor layer 130, air layer 140, and vapor-air transition detection sensor 150. In some examples, vapor layer 130 and air layer 140 are both colorless. In some examples, system 100 uses two-phase liquid immersion cooling to cool heat-generating component 120, which may be submerged in dielectric liquid 110.

In some examples, dielectric liquid 110 is selected based on an operating temperature of heat-generating component 120. For example, dielectric liquid 110 may be selected such that dielectric liquid no has a boiling point that is at or below the operating temperature of heat-generating component 120. In some examples, system 100 may further include other various suitable components not shown in FIG. 1, such as a condenser that is arranged to convert two-phase vapors in vapor layer 130 back into dielectric liquid 110.

In some examples, system 100 includes a tank, and heat-generating component 120 that includes heat-generating components, such as servers, memory, storage, networking components, other devices, or the like. In some examples, system 100 is a computing system, and heat-generating component 120 includes a CPU and other components of the computer system that are liquid cooled. In examples in which system 100 is a computing system, system 100 include enclosure other than a tank, such as a computer case.

In some examples, vapor layer 130 is above dielectric liquid 130, and air layer 140 is above vapor layer 130. Vapor layer 130 may include two-phase vapors. The two-phase vapors in vapor layer 130 may have a significantly greater density than air and therefore may tend to be below the air in air layer 140 but above dielectric liquid 110.

In some examples, vapor-air transition detection sensor 150 includes a strip of thermo-conductive material. In some examples, the strip of thermo-conductive material includes, acts as, or is a heat pipe. In some examples, vapor-air transition detection sensor 150 is disposed above dielectric liquid 110, in a position with the expected vapor-air transition zone near the middle of vapor-air transition detection sensor 150. In some examples, system 100 is arranged to cool a portion of vapor-air transition detection sensor 150. For instance, in some examples, the top end of vapor-air transition detection sensor 150 is cooled. In some examples, approximately the middle of vapor-air transition detector iso, about where the vapor-air transition is expected, is cooled.

Cooling the portion of vapor-air transition detection sensor 150 may be accomplished in different suitable ways in different examples. For instance, in some examples, a suitable cold plate or a suitable thermoelectric device such as a Peltier cooler may be used to cool the portion of vapor-air transition detection sensor 150. In some examples, fins coupled to vapor-air transition detection sensor 150 are exposed to external ambient conditions or other cool environment, one surface of vapor-air transition detection sensor 150 is exposed to external ambient conditions of other cool environment, or using a suitable cold plate, are all methods for cooling the surface temperature of the portion of vapor-air transition detection sensor 150 below the boiling point or boiling temperature of the liquid. In some examples, the cold plate may be a small heat exchanger that is employed to cool a liquid, such as chilled water. In some examples, the cold plate uses the same chilled water as the condenser. In some examples, the cold plate may be used at the top end of the strip to cool the top end of the strip, rather than using a thermo-electric cooler to cool the top end of the strip.

In some examples, by cooling the portion of vapor-air transition detection sensor 150, vapor-air transition detection sensor 150 will have different temperatures at different points along the length of the vapor-air transition detection sensor 150 based on whether that point is in vapor layer 130 or air layer 140, as discussed above. For instance, in some examples, a portion of the vapor air-transition detection sensor 150 residing in vapor layer 130 will cause the surrounding vapor to condense, which holds the surface temperature of vapor-air transition detection sensor 150 near the boiling point of dielectric liquid no. In some examples, the section of vapor-air transition detection sensor 150 exposed to air will cool the air in air layer 140 and the surface of vapor-air transition detection sensor 150 in air layer 140 to a lower temperature. In some examples, the point along the length of vapor-air transition detection sensor 150 where the surface temperature of vapor-air transition detection sensor 150 drops below the boiling point of dielectric liquid 110 corresponds to the transition layer between the air and the two-phase vapors.

In some examples, because vapor 130 and air layer 140 are both colorless, the vapor-air boundary itself cannot be seen. In some examples, vapor-air transition detection sensor 150 is coated with a thermo-chromatic material such as a dye or paint that changes color at the temperature corresponding to the boiling point of dielectric liquid no. In some examples, thermo-chromatic liquid crystals, Leuco dyes, or the like may be employed as the thermo-chromatic material. In this way, in these examples, the location of the vapor-air transition can be visually seen by observing vapor-air transition detection sensor 150.

In some examples, an array of temperature sensors is attached along the length of vapor-air transition detection sensor 150. The temperature sensors may be thermocouples, thermal sensing diodes, or other suitable sensors for measuring temperature. In these examples, the location of the vapor-air transition is then known to be between the two adjacent temperature sensors of the array at which one of the adjacent sensors detects that the surface temperature of vapor-air transition detection sensor 150 is at the boiling point of dielectric liquid 110 and the other adjacent sensor detects that the surface temperature of vapor-air transition detection sensor 150 is below the boiling point of dielectric liquid 110.

Figure 2:
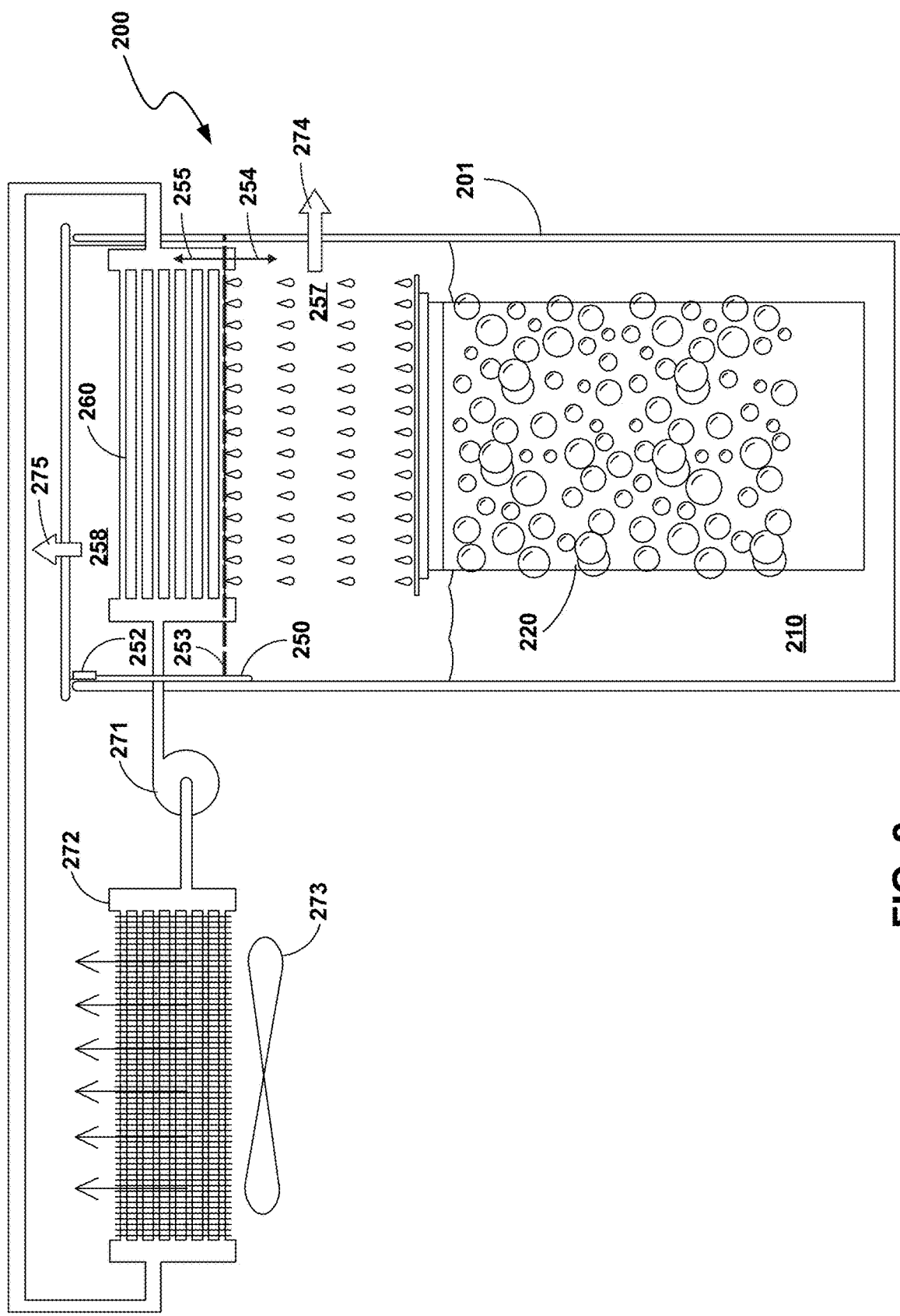
FIG. 2 is a block diagram illustrating an example of a liquid-cooled system that may be employed as an example of the liquid-cooled system of FIG. 1.

FIG. 2 is a diagram illustrating an example of liquid-cooled system 200. In some examples, liquid-cooled system 200 is cooled via two-phase liquid-immersion cooling. Liquid-cooled system 200 may include tank 201, pump 271, air-to-liquid heat exchanger 272, and fan 273. Tank 200 may include dielectric liquid 210, heat-generating component 220, vapor-air transition detection sensor 250, thermo-electric cooler 252, and condenser 260. Heat-generating component 220 may be submerged in dielectric liquid 210. Dielectric liquid 210 may be a dielectric liquid having a boiling point that is at or below the operating temperature of heat-generating component 220. In some examples, dielectric liquid 210 may act as a refrigerant, coolant, or the like. Tank 201 may include two-phase vapors above dielectric liquid 210, and may further include air above the two-phase vapors. In some examples, condenser 26o, together with pump 271, air-to-liquid heat exchanger 272, and fan 273, are arranged to convert two-phase vapors in tank 201 back to dielectric liquid 210.

In some examples, vapor-air transition detection sensor 250 includes a strip of material that is highly thermally conductive. In some examples, the strip of thermo-conductive material includes, acts as, or is a heat pipe. In other examples, the strip of material is a strip of highly thermally conductive metal, such as copper. In some examples, vapor-air transition detection sensor 250 is disposed above the dielectric liquid, in a position with the expected vapor-air transition zone near the middle of the vapor-air transition detection sensor. In some examples, vapor-air transition detection sensor 250 is attached to a side wall of tank 201.

In some examples, vapor-air transition detection sensor 250 is a handheld device that can be inserted into the environment when desired. That is, in some examples, rather than vapor-air transition detector 250 being fixed in place, an operator may hold vapor-air transition detector sensor 250 and place vapor-air transition detector sensor 250 into tank 201 so that the middle of vapor-air transition detector 250 is about where the vapor-air transition is expected.

In some examples, system 200 is arranged to cool a portion of vapor-air transition detection sensor 250 below the boiling point of the two-phase vapors. For instance, in some examples, the top end of vapor-air transition detection sensor 250 is cooled, such as by attaching a cooling mechanism to the top end of vapor-air transition detection sensor 250, such as thermo-electric cooler 252. In other examples, the portion of the vapor-air transition detection sensor may be a suitable portion of the vapor-air transition detection sensor 250 other than the top end, such as approximately the middle of vapor-air transition detection sensor 250, about where the vapor-air transition is expected. As discussed above, the cooling of the vapor-air transition detection sensor 250 will have different effects on the regions of vapor-air transition detection sensor 250 in contact with the air layer than on the regions in contact with the vapor layer, e.g., due to the different properties of the vapor layer and the air layer.

In some examples, because the portion of vapor-air transition detection sensor 250 is being cooled, the two-phase vapors will condense, holding the surface temperature of vapor-air transition detection sensor 250 near the boiling point of dielectric liquid 210. In some examples, the section of vapor-air transition detection sensor 250 exposed to air will cool the air and the surface of vapor-air transition detection sensor 250 in the air layer to a lower temperature. In some examples, the point along the length of vapor-air transition detection sensor 250 where the surface temperature of vapor-air transition detection sensor 250 drops below the boiling point of dielectric liquid 210 corresponds to the transition layer between the air and the two-phase vapors.

In some examples, vapor-air transition detection sensor 250 is coated with a thermo-chromatic material such as a thermo-chromatic dye or a thermo-chromatic paint that changes color at the temperature corresponding to the boiling point of dielectric liquid 210. In this way, in these examples, the location of the vapor-air transition can be visually seen by observing vapor-air transition detection sensor 250. In some examples, a camera may be used to view vapor-air transition detector sensor 250. In this way, in some examples, an operator can use the camera to see vapor-air transition detector 250, even if vapor-air transition detector 250 is an enclosed environment, so that the operator can determine the location of the vapor-air transition. In some examples, the location of the vapor-air transition includes the height of the vapor-air transition from a bottom of tank 201.

In some examples, an array of temperature sensors is attached along the length of vapor-air transition detection sensor 250. The temperature sensors may be thermocouples, thermal sensing diodes, or other suitable sensors for measuring temperature. In these examples, the location of the vapor-air transition is then known to be approximately between the two adjacent temperature sensors of the array, as follows. For instance, the location of the transition may be detected to be between two adjacent sensors where one of the adjacent sensors detects that the surface temperature of vapor-air transition detection sensor 250 is at the boiling point of dielectric liquid 210 and the other adjacent sensor detects that the surface temperature of vapor-air transition detection sensor 250 is below the boiling point of dielectric liquid 210. In some examples, the readings from the temperature sensor are sent to one or more other devices, where at least one of those devices takes one or more actions based on the detected location of the vapor-air transition.

For example, if it is determined that the vapor-air boundary, as indicated by the dashed line 253, is too high in tank 201, steps may be taken to remove the vapor 257, as shown by arrow 274, such that vapor-air boundary 253 is lowered, as indicated by arrow 254. For instance, the outputs of the array of temperature sensors may be used to turn on a switch if the outputs of the array of temperature sensors indicates that the vapor-air boundary 253 is too high. In these examples, turning on the switch may cause a valve to open that increases water flow through condenser 260, causing the condenser power to increase to lower the vapor level. Lowering the vapor level may prevent the vapor 257 from wastefully escaping tank 201. As another example, if the vapor-air boundary 253 is too low in tank 201, a pump may be switched on in order to pump air 258 out of tank 201, or a valve may be opened to let air 258 out of tank 201 such that the vapor-air boundary 253 is raised, as indicated by arrow 255. In some examples, the vapor 257 is significantly denser than the air 258, so that the air 258 above the vapor 257 would mostly include air 258 with only a relatively small amount of vapor 257 present. Removing air 258 from tank 201, as shown by arrow 275, when the vapor-air boundary 253 is too low may allow the vapor-air boundary 253 to remain below the level of condenser 260 so that air does not enter condenser 260 and interfere with the proper operation of condenser 260.

In some examples, in response to a problematic level of vapor being detected, the operations of heat-generating component 220 may be altered, such as by offloading compute resources, reducing workload, or the like.

Figure 3:
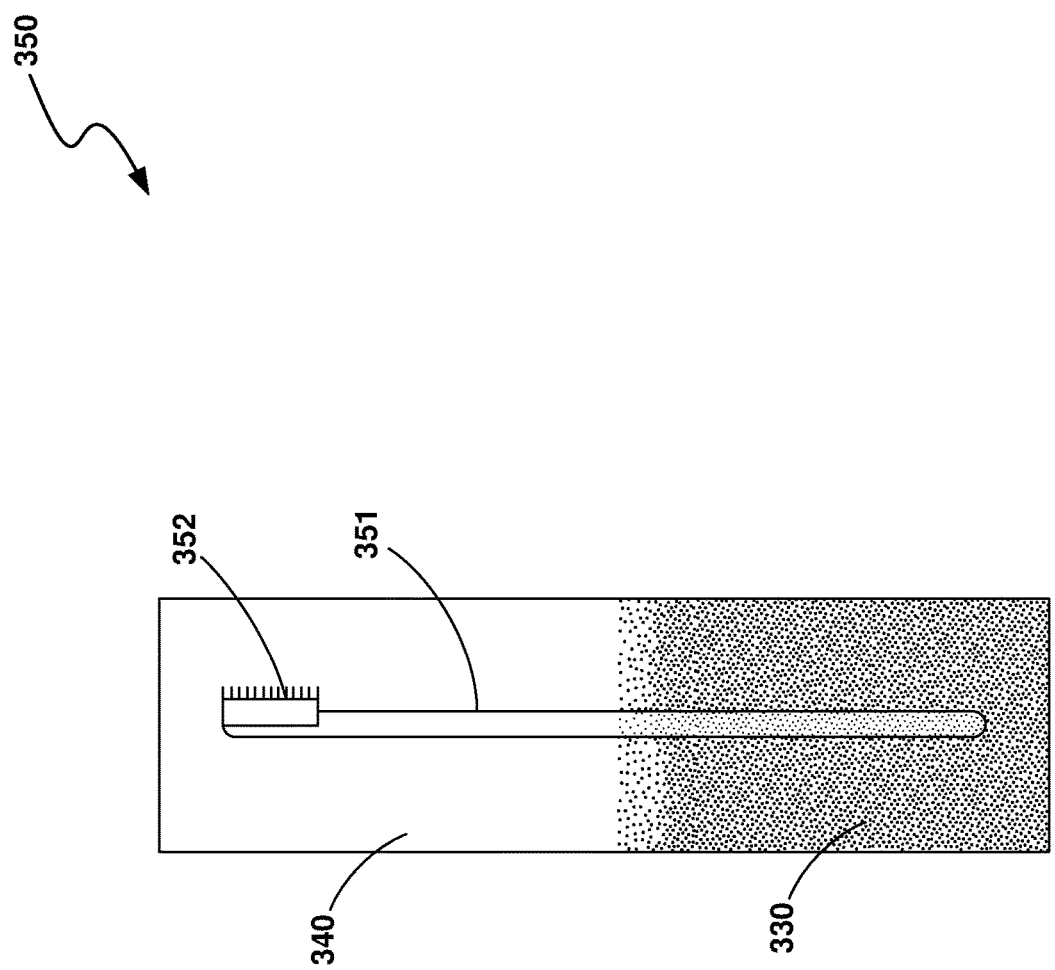
FIG. 3 is a diagram illustrating an example of a transition sensor that may be employed as an example of the transition sensor of the liquid-cooled system of FIG. 1 or FIG. 2.
Figure 4:
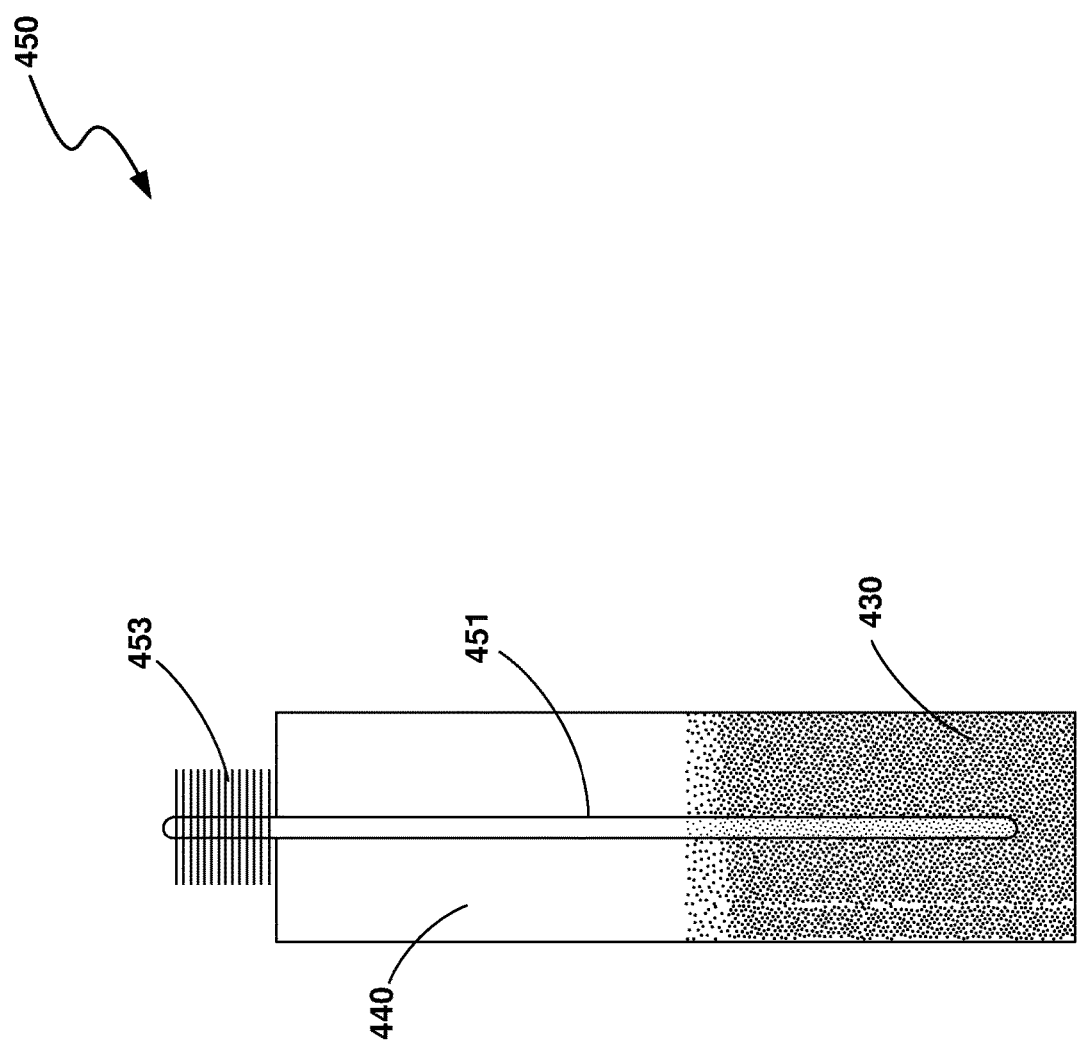
FIG. 4 is a diagram illustrating another example of a transition sensor that may be employed as an example of the transition sensor of the liquid-cooled system of FIG. 1 or FIG. 2.
Figure 5:
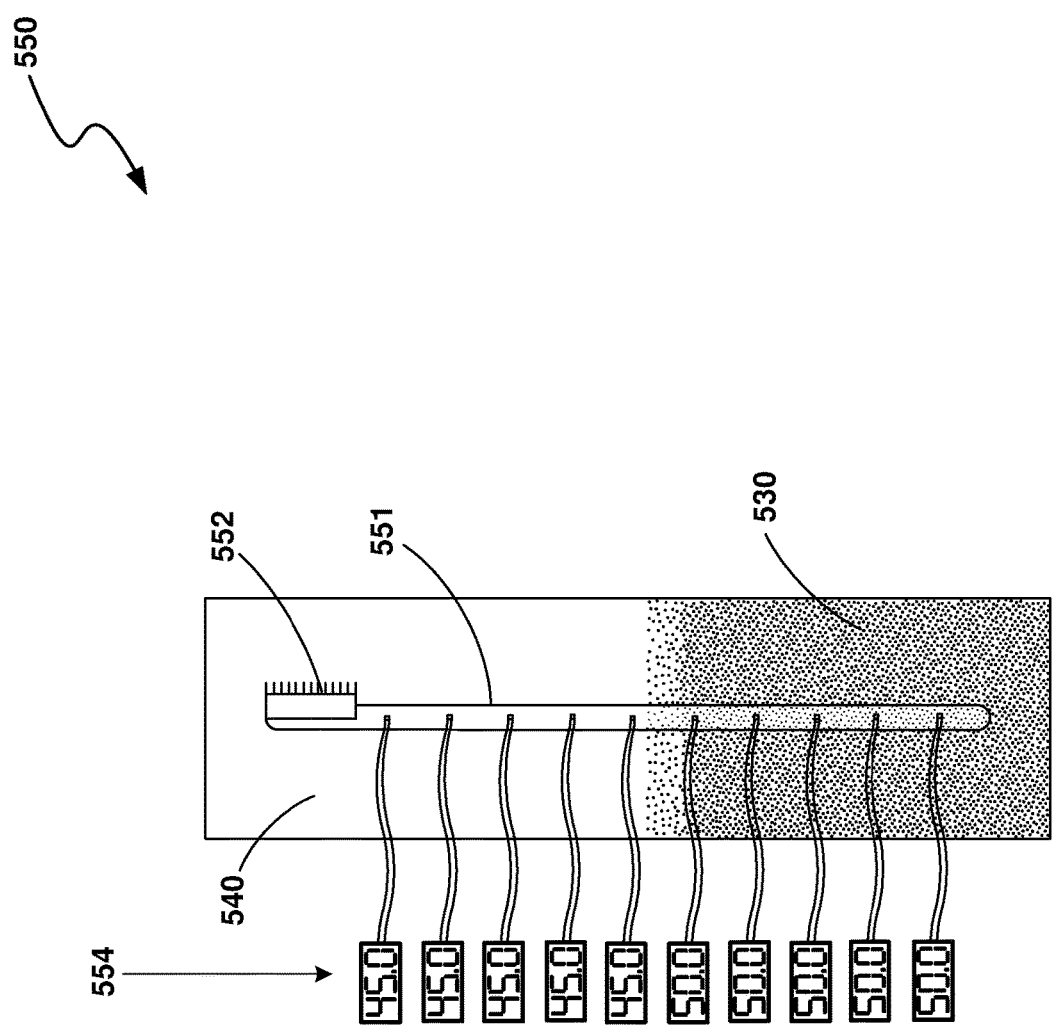
FIG. 5 is a diagram illustrating yet another example of a transition sensor that may be employed as an example of the transition sensor of the liquid-cooled system of FIG. 1 or FIG. 2.

FIG. 3-FIG. 5 below show three different examples of vapor-air transition detector sensor 250.

FIG. 3 is a diagram illustrating an example of transition sensor 350.

Transition sensor 350 may be employed as an example of vapor-air transition detection sensor 150 of FIG. 1 or vapor-air transition detection sensor 250 of FIG. 2. Transition sensor 350 may include heat pipe 351 and thermo-electric cooler 352. In some examples, a portion of transition sensor 350 is in vapor layer 33o, and another portion of transition sensor 350 is in air layer 340.

In some examples, thermo-electric cooler 352 includes a heat sink. In some examples, thermo-electric cooler 352 is arranged to cool the top end of heat pipe 351. Accordingly, FIG. 3 shows one suitable way in which the transition sensor may be cooled. In some examples, heat pipe 351 is coated with a thermo-chromatic dye that changes color at the temperature corresponding to the boiling point of the dielectric liquid. In this way, in these examples, the color in the thermo-chromatic dye coated on heat pipe 351 visually shows the location of the vapor-air transition.

FIG. 4 is a diagram illustrating an example of transition sensor 450. Transition sensor 450 may be employed as an example of vapor-air transition detection sensor 150 of FIG. 1 or vapor-air transition detection sensor 250 of FIG. 2. Transition sensor 450 may include heat pipe 451 and fins 453. In some examples, a portion of transition sensor 450 is in vapor layer 43o, and another portion of transition sensor 450 is in air layer 440.

In some examples, fins 453 provide a finned area that is external to the tank (e.g., tank 201) that cools the top end of heat pipe 451. In some examples, a fan could be used to blow air across the finned area, serving to further cool the finned area. Accordingly, FIG. 4 shows one suitable way in which the transition sensor may be cooled. In some examples, heat pipe 451 is coated with a thermo-chromatic dye that changes color at the temperature corresponding to the boiling point of the two-phase liquid. In this way, in these examples, the color in the thermo-chromatic dye coated on heat pipe 451 visually shows the location of the vapor-air transition.

FIG. 5 is a diagram illustrating an example of transition sensor 550. Transition sensor 550 may be employed as an example of vapor-air transition detection sensor 150 of FIG. 1 or vapor-air transition detection sensor 250 of FIG. 2. Transition sensor 550 may include heat pipe 551, thermo-electric cooler 552, and sensor array 554. In some examples, a portion of transition sensor 550 is in vapor layer 530, and another portion of transition sensor 550 is in air layer 540.

In some examples, thermo-electric cooler 552 includes a heat sink. In some examples, thermo-electric cooler 552 is arranged to cool the top end of heat pipe 551. Accordingly, FIG. 5 shows one suitable way in which the transition sensor may be cooled.

In some examples, sensor array 554 includes an array of temperature sensors attached along the length of heat pipe 551. Each of the temperatures sensors in sensor array 554 may read the temperature from a corresponding point along the length of heat pipe 551. In some examples, the temperature sensors in sensor array 554 are each spaced a half of an inch apart from each other along the length of heat pipe 551. In other examples, other suitable spacings for the temperature sensors in sensor array 554 are employed. In these examples, the location of the vapor-air transition is then known to be between the two adjacent temperature sensors of sensor array 554 at which one of the adjacent sensors of sensor array 554 detects that the surface temperature of heat pipe 551 is at the boiling point of the dielectric liquid and the other adjacent sensor detects that the surface temperature of heat pipe 551 is below the boiling point of the dielectric liquid.

In the example illustrated in FIG. 5, the boiling point of the two-phase liquid is 50 degrees Celsius. In the example illustrated in FIG. 5, the top five sensors in sensor array 554 read a temperature of 45.0 degrees Celsius, and the bottom five sensors in sensor array 554 read a temperature of 50.0 Celsius, which is the boiling point of the two-phase liquid. Accordingly, in this example, it may be determined that the vapor-air transition is between the bottom sensor that reads 45.0 degrees Celsius and the top sensor that reads 50.0 degrees Celsius.

Illustrative Process

Figure 6:
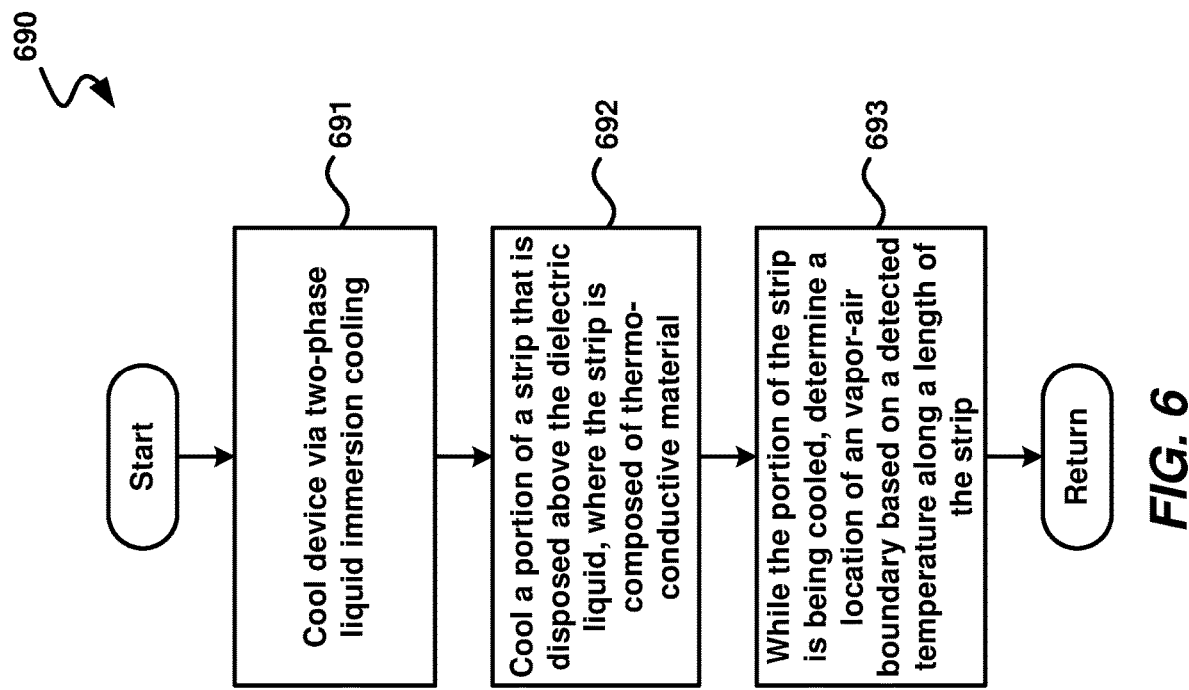
FIG. 6 is a flow diagram illustrating an example process for a vapor-air transition detection for two-phase liquid immersion cooling, in accordance with aspects of the invention.

FIG. 6 is a diagram illustrating an example dataflow for a process (690) for vapor-air transition detection for two-phase liquid immersion cooling. In some examples, process 690 may be performed by an example of system 100 of FIG. 1, system 200 of FIG. 2, transition sensor 350 of FIG. 3, transition sensor 450 of FIG. 4, transition sensor 550 of FIG. 5, or the like.

In the illustrated example, step 691 occurs first. At step 691, in some examples, a first device is cooled via two-phase liquid immersion cooling. In some examples, the first device is submerged in a dielectric liquid in a system. In some examples, a vapor layer is disposed above the dielectric liquid. In some examples, an air layer is disposed above the vapor layer. As shown, step 692 occurs next in some examples. At step 692, in some examples, a portion of a first strip that is disposed in the system above the dielectric liquid is cooled. In some examples, the first strip is composed of a thermo-conductive material. As shown, step 693 occurs next in some examples. At step 693, in some examples, while the portion of the first strip is being cooled, via the first strip, a location of a vapor-air boundary in the system is determined based on a detected temperature along a length of the first strip. The process may then advance to a return block, where other processing is resumed.

CONCLUSION

While the above Detailed Description describes certain examples of the technology, and describes the best mode contemplated, no matter how detailed the above appears in text, the technology can be practiced in many ways. Details may vary in implementation, while still being encompassed by the technology described herein. As noted above, particular terminology used when describing certain features or aspects of the technology should not be taken to imply that the terminology is being redefined herein to be restricted to any specific characteristics, features, or aspects with which that terminology is associated. In general, the terms used in the following claims should not be construed to limit the technology to the specific examples disclosed herein, unless the Detailed Description explicitly defines such terms. Accordingly, the actual scope of the technology encompasses not only the disclosed examples, but also all equivalent ways of practicing or implementing the technology.

We claim:

1. An apparatus for two-phase liquid immersion cooling, comprising:
    a first enclosure that is configured to contain a dielectric liquid having a boiling point, a vapor layer above the dielectric liquid layer, and an air layer above the vapor layer, such that a vapor-air boundary is disposed between the vapor layer and the air layer;
    a condenser that is configured to condense vapor in the vapor layer; and
    a first strip within the first enclosure that is disposed above the dielectric liquid, wherein the first strip is composed of a thermo-conductive material, wherein the apparatus is configured to cool a portion of the first strip to a temperature below the boiling point of the dielectric liquid layer, and wherein the apparatus is further configured to determine a location of the vapor-air boundary based on a detected temperature along a length of the first strip.

2. The apparatus of claim 1, wherein the condenser is arranged to convert the vapor in the vapor layer into the dielectric liquid.

3. The apparatus of claim 1, wherein the first strip includes a heat pipe.

4. The apparatus of claim 1, the apparatus further comprising a plurality of temperature sensors that are disposed along a length of the first strip, and wherein the apparatus is configured to determine, based on the first strip, the location of the vapor-air boundary based on the plurality of temperature sensors.

5. The apparatus of claim 1, wherein the first strip is coated with a thermo-conductive material that is based on a temperature of the thermo-conductive material such that a color of the thermo-conductive material changes from one color to another color at about a boiling temperature of the dielectric liquid, and wherein the apparatus is configured to determine, based on the first strip, the location of the vapor-air boundary based on the color of the thermo-conductive material.

6. A method, comprising:
    cooling, via two-phase liquid immersion cooling, a first device submerged in a dielectric liquid in a system, the dielectric liquid having a boiling point, wherein a vapor layer is disposed above the dielectric liquid, wherein an air layer is disposed above the vapor layer;

cooling a portion of a first strip that is disposed in the system above the dielectric liquid to a temperature below the boiling point of the dielectric liquid, wherein the first strip is composed of a thermo-conductive material; and while the portion of the first strip is being cooled, determining, via the first strip, a location of a vapor-air boundary in the system between the air layer and the vapor layer, based on a detected temperature along a length of the first strip.

7. The method of claim 6, wherein the first strip includes a heat pipe.

8. The method of claim 6, wherein the portion of the first strip is a top end of the first strip.

9. The method of claim 6, wherein the first strip is coated with the thermo-conductive material, wherein the thermo-conductive material, in response to reaching a temperature corresponding to the dielectric liquid, changes from one color to another color, and wherein determining, via the first strip, the location of the vapor-air boundary based on the detected temperature along the length of the first strip is based on the color of the thermo-conductive material along the length of the first strip.

10. The method of claim 6, wherein a plurality of temperature sensors are disposed along a length of the first strip, and wherein determining, via the first strip, the location of the vapor-air boundary based on the detected temperature along the length of the first strip is accomplished via the plurality of temperature sensors.

11. The method of claim 6, wherein cooling the portion of the first strip is accomplished via a thermo-electric cooler.

12. The method of claim 6, wherein cooling the portion of the first strip is accomplished by exposing a plurality of fins that are coupled to the first strip to a cold environment.

13. The method of claim 6, further comprising:
determining whether a location of the vapor-air boundary is below a first threshold; and
upon determining that the location of the vapor-air boundary is below the first threshold, removing air from the system such that the vapor-air boundary is raised.

14. The method of claim 6, further comprising:
determining whether a location the vapor-air boundary is above a first threshold; and
upon determining that the location of the vapor-air boundary is above the first threshold, removing vapor such that the vapor-air boundary is lowered.

15. An apparatus, comprising:
a first strip that is composed of a thermo-conductive material; and
a first thermo-sensor that is coupled to the first strip, wherein the first thermo-sensor is arranged such that, upon at least a portion of the first strip being cooled to a temperature below a boiling point of a dielectric liquid while the first strip is disposed above the dielectric liquid, the first thermo-sensor being capable of determining a location of a vapor-air boundary above the dielectric liquid based on a detected temperature along a length of the first strip, and wherein the first thermo-sensor includes at least one of a thermo-chromatic material along the length of the first strip or an array of thermal sensors disposed along the length of the first strip.

16. The apparatus of claim 15, wherein the first strip includes a heat pipe.

17. The apparatus of claim 15, further comprising a thermo-electric cooler that is coupled to the first strip, wherein the thermo-electric cooler is arranged to cool the portion of the first strip.

18. The apparatus of claim 15, wherein the first thermo-sensor includes the array of thermal sensors disposed along the length of the first strip, and wherein each thermal sensor of the array of thermal sensors includes a thermocouple.

19. The apparatus of claim 15, wherein the first thermo-sensor includes the array of thermal sensors disposed along the length of the first strip, and wherein each thermal sensor of the array of thermal sensors includes a thermal sensing diode.

20. The apparatus of claim 15, wherein the first thermo-sensor includes the thermo-chromatic material along the length of the first strip, wherein the thermo-chromatic material is a thermo-chromatic dye, and wherein the thermo-chromatic dye changes color at about a boiling temperature of the dielectric liquid.

* * * * *